(12) United States Patent
Sharma et al.

(10) Patent No.: US 8,699,537 B2
(45) Date of Patent: Apr. 15, 2014

(54) APPLICATION-ORIENTED NITRIDE SUBSTRATES FOR EPITAXIAL GROWTH OF ELECTRONIC AND OPTOELECTRONIC DEVICE STRUCTURES

(76) Inventors: Tarun Kumar Sharma, Pittsburgh, PA (US); Elias Towe, Pittsburgh, PA (US)

( * ) Notice: Subject to any disclaimer, the term of this patent is extended or adjusted under 35 U.S.C. 154(b) by 0 days.

(21) Appl. No.: 12/914,386

(22) Filed: Oct. 28, 2010

(65) Prior Publication Data
US 2011/0103421 A1 May 5, 2011

Related U.S. Application Data

(60) Provisional application No. 61/279,994, filed on Oct. 29, 2009.

(51) Int. Cl.
*H01S 5/00* (2006.01)
(52) U.S. Cl.
USPC .................................. 372/45.012; 372/43.01
(58) Field of Classification Search
USPC .......................................... 372/43.01, 45.012
See application file for complete search history.

(56) References Cited

U.S. PATENT DOCUMENTS

| | | | | |
|---|---|---|---|---|
| 7,915,625 | B2 * | 3/2011 | Karino et al. | 257/94 |
| 2006/0225643 | A1 * | 10/2006 | Amano et al. | 117/89 |
| 2008/0083910 | A1 * | 4/2008 | Scholz et al. | 252/521.5 |
| 2009/0108297 | A1 * | 4/2009 | Sato et al. | 257/192 |
| 2012/0187454 | A1 * | 7/2012 | Haskell et al. | 257/201 |

OTHER PUBLICATIONS

Boota et al, Growth of GaN on Lattice Matched AlInN Substrates, 2008, Linkoping University, Department of Physics, Chemistry and Biology.*
TDI, World's First InGaN Substrates Available From TDI, Aug. 2007, Technologies and Devices International, Inc.*

* cited by examiner

*Primary Examiner* — Armando Rodriguez
(74) *Attorney, Agent, or Firm* — Kratz, Quintos & Hanson, LLP

(57) ABSTRACT

The present invention provides an applications-oriented nitride compound semiconductor substrate, and devices based on it, whose lattice constant can be tuned to closely match that of any nitride thin film or films deposited on it for specific electronic or optoelectronic device applications. Such application-oriented nitride substrates, which can be composed of ternary $In_xGa_{1-x}N$, $Al_yIn_{1-y}N$, $Al_zGa_{1-z}N$, or quaternary $Al_aIn_bGa_{1-a-b}N$ alloy compounds, minimize lattice-mismatch-induced dislocations and defects between the epitaxial films and the substrate on which the device layers are grown, leading to substantially improved device performance.

11 Claims, 5 Drawing Sheets

APPLICATION-ORIENTED NITRIDE SUBSTRATES FOR EPITAXIAL GROWTH OF ELECTRONIC AND OPTOELECTRONIC DEVICE STRUCTURES

RELATED APPLICATION

This application claims the benefit of U.S. Provisional Application No. 61/279,994, filed Oct. 29, 2009.

FIELD OF THE INVENTION

The present invention relates to epitaxial growth of thin film semiconductors on base substrates; more specifically, it relates to the growth of compound semiconductor films on base substrates comprised of ternary or quaternary materials whose compositions and hence lattice constants can be adjusted at will to match the lattice constant(s) of the over-layer device films to be grown on them.

BACKGROUND OF THE INVENTION

Demand for compound semiconductor materials whose properties can be tuned by adjusting the compositions of their constituent parts has been increasing with the need for electronic and optoelectronic devices that have superior performance characteristics for various application requirements at low cost. Compound semiconductors, such as those from group III and V, or from group IV of the Periodic Table of elements, have been, and continue to be the mainstay of modern electronic and optoelectronic technology. Appropriate compositions of III-V compound semiconductors comprised of (In,Ga,Al)(As,Sb,P), for example, grown on binary GaAs, GaSb, or InP base substrates are widely used in the manufacture of transistor, sensor, electronic memory, laser and light-emitting diode chips utilized in high-performance instruments such as radar systems, radios, and cell phones, to name only a few of the key applications of these materials. These same materials are also widely used to make semiconductor photodetectors that are widely used in high bandwidth fiber-optic communication systems, optical disk systems, such as compact disc, and digital versatile disc systems, specialty illumination systems, and advanced photovoltaic solar cells. In another example that illustrates the importance of tunable properties of compound semiconductors, various compositions of silicon-germanium (SiGe) grown on Si play a critical role in WiFi and wireless electronic systems. A fundamental requirement for being able to prepare thin films of semiconductor layers for device structures is the availability of base substrates on which new films can be grown. The thin films can generally be doped lightly N-type ($10^{16}$ cm$^{-3}$) or heavily N-type ($\geq 9\times 10^{18}$ cm$^{-3}$); they may also be doped lightly or heavily P-type. A device structure grown on a substrate is defined to be a sequence of thin film layers whose composition, thickness, doping type and levels, electrical, and optical properties are selected or designed to allow the ensemble to perform a specific function. The substrate material must generally be structurally and chemically compatible with the thin films to be deposited on it. Furthermore, the in-plane periodicity of the atoms of the base substrate must match that of the desired over-layer thin films to be deposited on the base. Substrates must provide appropriate initiation or seeding surfaces on which new growth can occur. For common III-V compound semiconductors such as (In,Al,Al)(As, Sb,P), it has been possible to satisfy this requirement by using binary GaAs, GaSb, or an InP base substrates. Even though the in-plane atomic periodicity of these substrates do not match all compositions of (In,Ga,Al)(As,Sb,P) one can choose appropriate percentage compositions of (In,Ga,Al) (As,Sb,P) that can be approximately matched to the binary GaAs, GaSb, or InP substrates so that there is an acceptable atomic registry between the base substrate and the thin films on top. When this atomic registry is grossly mismatched, say by more than 3%, a defect-free thick film of the over-layer material cannot be uniformly grown on the substrate. The thickness depends on the particular composition of the over-layer desired. It can range from as thin as a few nanometers to as thick as hundreds of nanometers. The mismatch, often referred to as a lattice-mismatch, can lead to atomic dislocations that interrupt the pristine periodicity and order of the atoms in the thin film over-layer. The major consequence of this mismatch and the resulting dislocations is an impairment of the electronic and optical properties of the thin films. This can sometimes be mitigated by clever techniques such as deposition of intermediate layers with special temperature cycling steps (as discussed in Shibata's U.S. Pat. No. 7,771, 849) or deposition of compositionally graded (In,Ga,Al)(As, Sb,P) layers that progressively increase the percentage of one or more of the constituents of the material until the desired composition and corresponding lattice constant of the over-layer is reached. Another common mitigation technique is to deposit extremely thin (few nanometer) layers of two compositions of the over-layer in an alternating periodic fashion, thus forming what is called a superlattice. Such a superlattice structure alternately causes the films to be in compression and tension in such as manner that the mismatch is accommodated elastically without dislocations or defects. Both mitigation approaches only work when the mismatch is small or when only thin (sub-micrometer) over-layers are desired.

The class of III-V compounds comprised of two, three, or four constituent elements of (In,Ga,Al)(As,Sb, P), with at least one element from group III and one group V, have band gaps that range from a low 0.17 eV for InSb to a high of 2.45 eV for AlP. For certain applications, such as in light-emitting diodes that operate in the ultraviolet, blue, or green regions of the spectrum, the energy band gap value of compound semiconductors must be larger than 2.45 eV. The common class of compound semiconductors discussed previously is therefore not suitable for light-emission at wavelengths below red (<620 nm). However, another class of III-V compound semiconductors that is comprised of (In,Ga,Al)N can be used. This class of materials posses band gaps that stretch from 0.67 to 6.04 eV. These semiconductors are very useful for a number of applications in electronics and optoelectronics; however, they are challenging to produce in pristine thin film form. This is largely due to lack of a suitable base substrate for the initial thin film epitaxial process. Until recently, there were no chemically compatible binary nitride substrates. However, GaN and AlN binary substrates have now become available. Even with the availability of these substrates, it is still challenging to produce many desirable and useful structures for electronic or optoelectronic devices. Almost all electronic and optoelectronic device structures require multiple layers of thin films to be deposited one-on-top-of-the-other on the base substrates. The majority of films used for devices and composed from compound semiconductors usually differ in composition (and hence lattice constants) from the substrates on which they are deposited; this inevitably leads to lattice-mismatches originating from the substrates, leading to dislocations and defects that impair crystalline quality and degrade the properties of the over-layer films. The most common substrates currently used for epitaxial synthesis of any composition of (In,Ga,Al)N films include $\alpha$-Al$_2$O$_3$ (otherwise known as sapphire), SiC, GaN, and AlN. The binary compounds of SiC, GaN, and AlN are used in their bulk form. In this form, they can never be lattice-matched to the majority of ternary or quaternary compound semiconductor layers or structures that are most often grown on them. Prior to the advent of bulk binary nitride substrates, templates consisting of sapphire on which thin over-layers of GaN or AlN were grown, were used as base substrates. These templates can also never be lattice-matched to films grown on top of them because most device films are not comprised of binary materials and usually have lattice constants that are different from the binary templates on the sapphire. The major benefit of using bulk binary nitride substrates (GaN or AlN) is that they are chemically, thermally, and structurally compatible with device structures (which are constructed from a specific sequence of epitaxially grown thin films of various compositions of binary, ternary or quaternary films) that are grown on top of them. However, the lattice constant of any of the bulk binary nitride substrates or SiC can never be matched to that of any device structures grown on top of them for reasons stated in the foregoing. The lattice constant incompatibility has dogged the overarching goal of producing the highest performance or quality nitride device structures.

The need for substrates that are lattice-matched to the materials used in device structures grown on top of them is imperative because the mismatches constrain the diversity of compositions of compound semiconductor films that can be grown for devices of specific designs. This limitation manifests itself in many different forms. Often, because of the need to mitigate lattice-mismatch-induced dislocations and defects, epitaxial films are deliberately grown with non-optimal compositions or thicknesses. The non-optimality commonly leads to performance inefficiencies, for example, in lasers and light-emitting diodes that either emit much less optical power than desired or diodes that emit at wavelengths of less desirable colors. For electronic devices, lattice mismatches originating from base substrates degrade electron transport properties, thus limiting electron mobilities and hence high-frequency performance or switching speeds. The lack of ideal base substrates for epitaxial synthesis of (In,Ga, Al)N compound semiconductor films and device structures places a severe constraint on the diversity of device design, device performance, and ultimately overall system performance.

It is the objective of the present invention to remove these constraints by providing bulk ternary and quaternary base nitride substrates whose composition, and hence lattice constants, can be tuned to match any desirable composition(s) of over-layer structures for any device structure grown on them. It is further the object of the invention to provide an engineering flexibility that can accommodate small degrees of mismatches elastically without generation of dislocations or defects. Such an elastic accommodation can in fact be used to provide an additional degree of freedom of design.

SUMMARY OF THE INVENTION

The aforementioned constraints on the synthesis of (In,Ga, Al)N thin films on unsuitable binary GaN, AlN, InN, SiC, and sapphire substrates can be removed by using ternary or quaternary bulk nitride substrates whose lattice constants can be tuned to the films to be grown on them. Such substrates will be called Application-Oriented Nitride Substrates (AONS) because they are designed for specific device structures used in given applications. A bulk ternary nitride substrate may be comprised of three constituent elements wherein two of the elements are from group III of the Periodic Table and one from group V of the Periodic Table. A ternary substrate may therefore be comprised of $In_xGa_{1-x}N$, $In_xAl_{1-x}N$, or $Al_xGa_{1-x}N$, where the mole fraction, x, which can range from 0 to 100% can be properly adjusted to give the lattice constant of the desired composition of any nitride thin film to be synthesized on top of the substrate. The choice of lattice constant is determined by the desired band gap of the thin film which in turn depends on the constituent composition of the film. Those skilled in the art can readily calculate the lattice constant once the band gap is selected or known. The bulk nitride substrate may also be a quaternary alloy that is comprised of three constituent elements from group III of the Periodic Table and one element from group V of the Periodic Table. An example of nitride quaternary alloy substrate is $In_xAl_yGa_{1-x-y}N$, where the sum of the mole fractions x and y can range between 0 and 99%. The mole fractions x and y can be judiciously adjusted so that the lattice constant of the quaternary substrate is as close as desired to that of any thin film(s) to be synthesized on the substrate.

The thickness of the ternary or quaternary nitride substrates may range from 50 to 400 μm. They can be thicker than this if desired, but the minimum thickness is constrained only by practical mechanical handling considerations. These substrates may be oriented in any desired crystallographic directions or substrate planes. Planes with certain orientations are more favorable and therefore useful for certain device applications than others. For example, the non-polar low index planes such as $\{11\bar{2}0\}$ and $\{1\bar{1}00\}$, which are also known as the a and m planes respectively, are ideal for light-emitters. Other favored, but non-ideal surfaces include the family of $\{0001\}$ planes or the c-axis planes. Others include the semi-polar planes. A desirable plane should not lead to polarization or strain-induced electric fields in thin films grown on them.

The quaternary class of compound semiconductor materials subsumes both the binary and ternary classes. In the most general case, the quaternary may be represented as $A_xB_yC_{1-x-y}D$ where A, B, and C are group III elements and D is a group V element. In another representation, the alloy may be written as $A_xB_{1-x}C_yD_{1-y}$ where A and B are group III elements and C and D are group V elements. In this representation, the constituent elements of the quaternary do not have to be limited to just group III and V of the Periodic Table. Materials from group II and VI are also possible candidates for ternary or quaternary substrates in other applications.

DETAILED DESCRIPTION OF THE PREFERRED EMBODIMENTS

Figure 1:
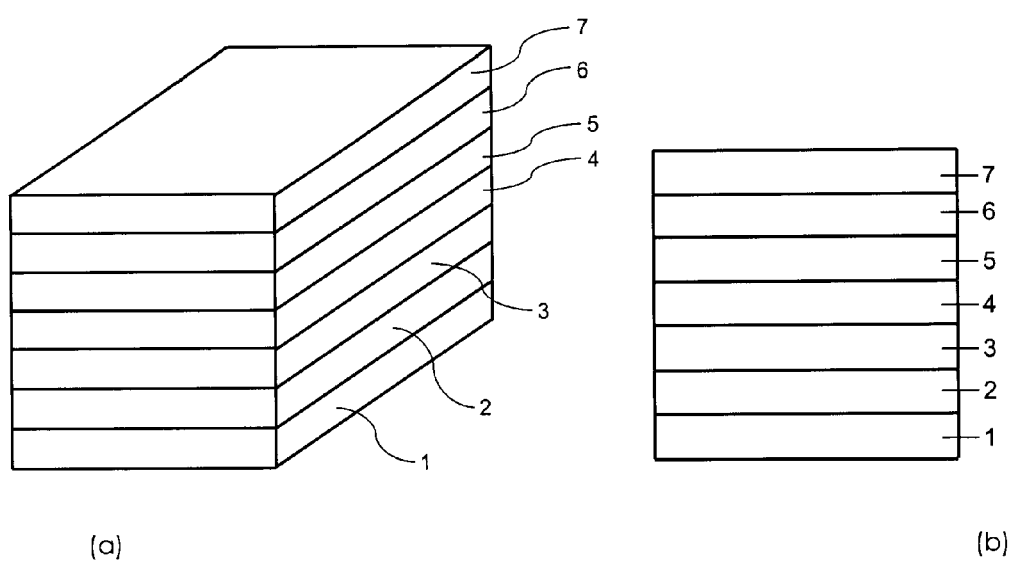
FIG. 1(a) is a perspective drawing of a nitride laser diode on a ternary or quaternary substrate, with the key thin film layers indicated.
FIG. 1(b) is schematic of one of the end-facets of the laser with all key thin film layers on a ternary or quaternary substrate indicated as in FIG. 1(a).

The present invention is a nitride substrate 1 in FIG. 1 comprised of a compound semiconductor that may contain three or four component elements in it as indicated. The specific elements of the compound semiconductor are drawn from group III and group V of the Periodic Table of elements. The fractional composition of each constituent element of the compound semiconductor is selected to result in a lattice constant for the substrate that is closely matched to that of the first thin film layer to be grown on it; and furthermore, to match as closely as possible the lattice constants of all subsequent layers shown in FIG. 1 that are grown on it. When an exact lattice match between substrate 1 and the active region layers 4 is not possible as is usually the case, then a lattice-mismatch of less than ±3.5% would be tolerable. Such an amount of mismatch leads to a (compressive or tensile) strain that can be accommodated pseudomorphically or elastically without defects or dislocations.

The principal layers of a nitride laser diode structure are shown in FIG. 1. This structure would be grown on an N-type Application-Oriented Nitride Substrate (AONS) 1, on top of which is a cladding layer 2 of a heavily doped N-type ternary nitride film whose lattice constant matches that of substrate 1, and an N-type lower waveguide layer 3 whose lattice constant is also nearly matched to substrate 1, but whose doping level is slightly less than that of layer 2 to enable a difference in optical index and to minimize absorption. Sandwiched between the lower waveguide layer 2 and an upper waveguide layer 5 is an undoped active region 4. The upper waveguide layer 5 is sparingly doped P-type. The active region may be comprised of a single quantum well or multiple quantum wells. The quantum well itself may be comprised of a ternary layer whose composition is determined by the desired wavelength of emission. The barrier layers sandwiching the quantum well must have the same composition (and consequently very similar lattices constant) as substrate 1. The emission wavelength of such a quantum well is determined by the difference in energy between the ground state confined electron energy level in the conduction band and the ground state confined hole energy level in the valence band of the well; these energy levels, in turn, are determined by the thickness of the well, its composition, the composition of the barriers, and the strain (if any) between the well layers and the barrier layers. On top of the upper waveguide layer 5 is a P-type cladding layer 6. Finally, on top of layer 6 is a heavily doped P-type contact layer 7 used to make electrical contact to the device.

Figure 2:
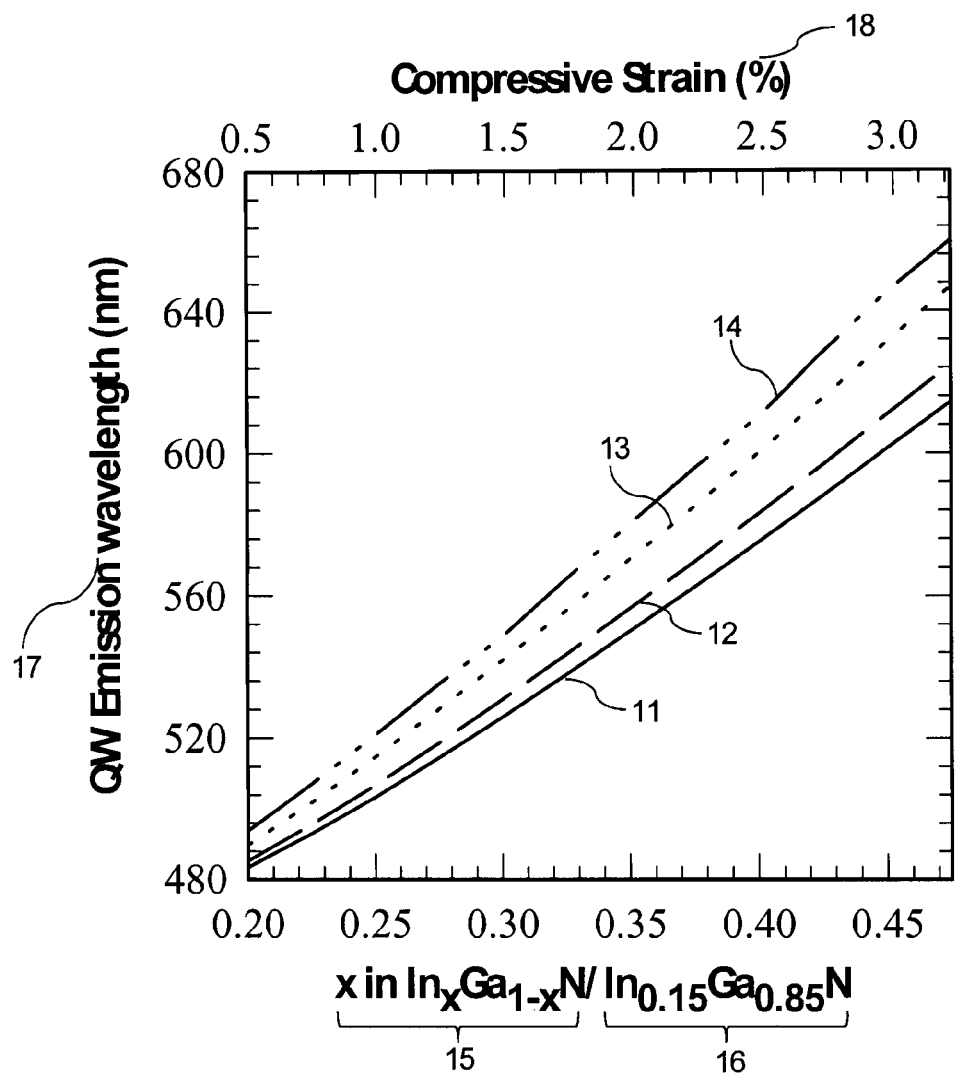
FIG. 2 is a diagram showing the emission wavelength of an active quantum-well region with compressive strain as a function of composition of the quantum well when the laser structure is grown on a ternary nitride substrate comprised of $In_{0.15}Ga_{0.85}N$ designed for use in the manufacture of lasers in the visible spectrum.

For nitride laser structures emitting in the visible region of the electromagnetic spectrum, the preferred substrate embodiment is a ternary compound semiconductor comprised of $In_yGa_{1-y}N$. Typically the value of y, which is the indium fraction in the alloy, can be as low as 10% and as high as 55% but most preferably about 15% for a composition that will permit growth of film layers for visible laser structures on this substrate. The visible spectrum is defined to be any wavelength color that can be derived by mixing the appropriate amounts of the primary colors of blue, green, and red which are visible to the human eye. Quantum-well active regions with compressive strain in them can be used to create lasers that emit between 480 and 650 nm as shown in FIG. 2. The preferred composition of the quantum-well layers is $In_xGa_{1-x}N$, where x is varied to yield the desired emission wavelength. For the visible spectrum, a general quantum-well structure is a sandwich comprised of an $In_yGa_{1-y}N$ barrier layer 16, a thin $In_xGa_{1-x}N$ quantum well layer 15, and another $In_yGa_{1-y}N$ barrier layer. FIG. 2 illustrates the variation of emission wavelengths 17 as a function of indium composition, x, in the quantum-well layer 15 for a nominal composition of y=15% in the barrier layer. The preferred barrier layer composition is chosen to cause a lattice constant match to that of substrate 1 in FIG. 1. The curve 11 in FIG. 2 corresponds to a quantum-well thickness of 2.5 nm; curve 12 to a quantum-well-size of 3 nm, curve 13 to a quantum-well-size of 5 nm, and curve 14 to a quantum-well-size of 10 nm. The substrate composition selected for this illustration leads to variable compressive stain 18 that depends on the indium composition in the quantum well.

Figure 3:
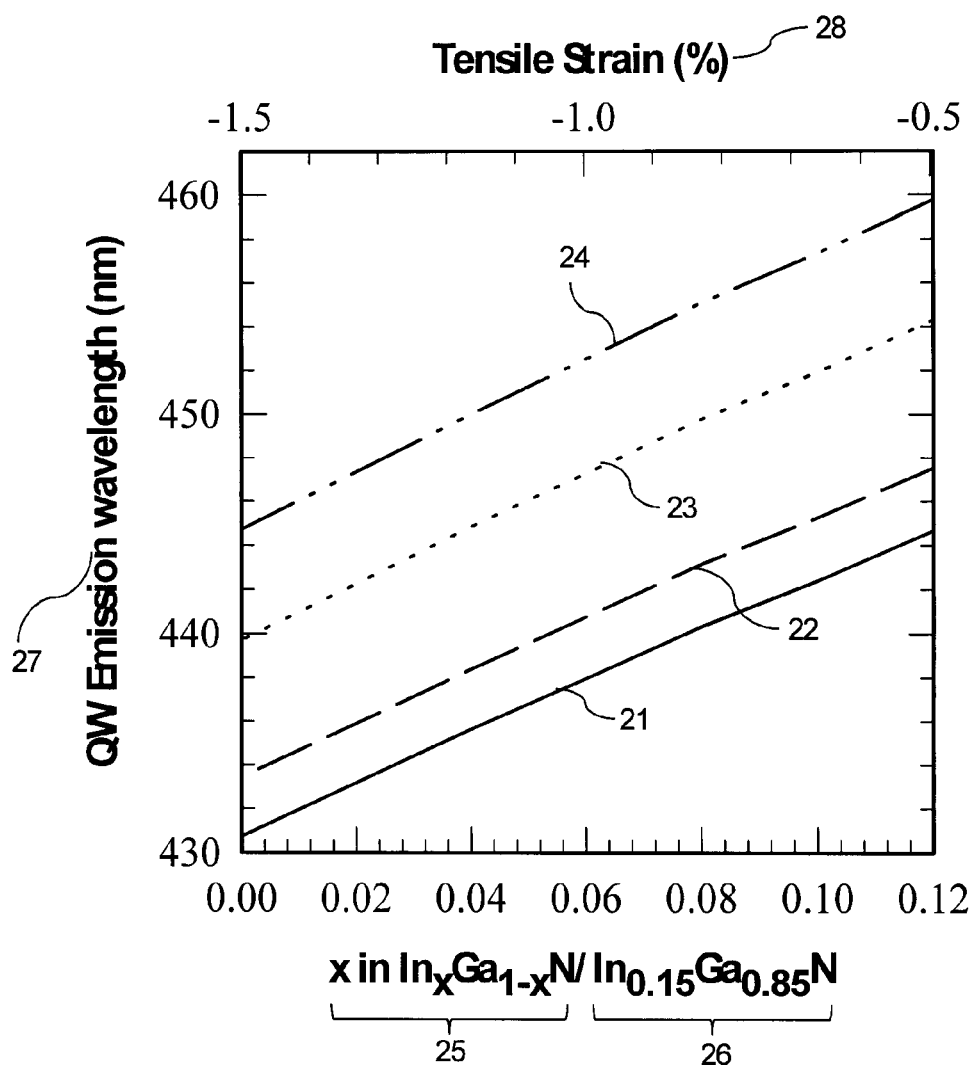
FIG. 3 is a diagram showing the emission wavelength of an active quantum-well region with tensile strain as a function of the indium composition in the quantum well when the laser structure is grown on a ternary nitride substrate comprised of $In_{0.15}Ga_{0.85}N$, designed for use in the manufacture of lasers in the visible spectrum.

To create laser structures that emit in the blue, tensile strain is required in the quantum-well active region. The tensile strain widens the difference between the conduction band ground state energy level and the valence band ground state energy level. The said energy difference leads to shorter wavelengths in the blue range of the spectrum. FIG. 3 illustrates the variation of emission wavelength 27 as the indium composition, x, in the quantum well layer 25 is varied for the quantum well sandwiched between the $In_yGa_{1-y}N$ barrier layers 26. The strain in a quantum-well structure of this type is tensile strain 28 which can be varied as function of indium composition, x. The emission wavelengths 27 vary as functions of quantum well thicknesses as shown in FIG. 3 for a 2.5-nm-quantum-well 21, a 3-nm-quantum-well 22, a 5-nm-quantum-well 23, and a 10-nm-quantum-well 24.

Figure 4:
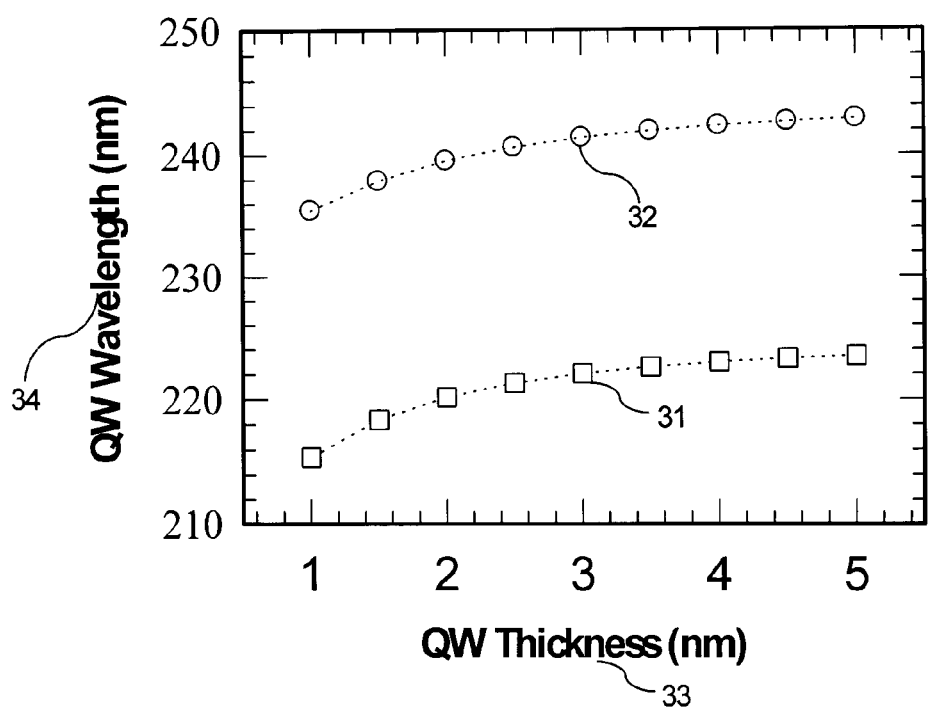
FIG. 4 is a graph showing the ultraviolet emission wavelength of a quantum-well structure as a function of the well thickness. In the curve 32, the emission is from an $Al_{0.64}Ga_{0.36}N$ quantum well that is surrounded by $Al_{0.80}Ga_{0.2}N$ barriers. This active region is grown on top of a ternary $Al_{0.85}Ga_{0.15}N$ substrate. In the curve 31, the emission is from a ternary $Al_{0.76}Ga_{0.24}N$ quantum well surrounded by $Al_{0.95}Ga_{0.05}N$ barriers grown on an AlN substrate.

The preferred embodiment for a quantum-well structure that emits in the deep ultraviolet region of the spectrum (with wavelengths ranging from 210 to 250 nm), is comprised of an $Al_zGa_{1-z}N$ quantum well sandwiched between $Al_qGa_{1-q}N$ barriers, where the aluminum fraction z in the quantum well is less than the aluminum fraction q in the barrier (z<q). Such a quantum-well structure is $Al_qGa_{1-q}N/Al_zGa_{1-z}N/Al_qGa_{1-q}N$. The graphs in FIG. 4 illustrate the variation of deep ultraviolet emission wavelength for $Al_qGa_{1-q}N/Al_zGa_{1-z}N/Al_qGa_{1-q}N$ quantum-well structures of various thicknesses. For an aluminum fraction of z=64% and a well sandwiched between barriers with an aluminum fraction of q=80%, curve 32 shows the variation of the emission wavelength as a function of the quantum-well width 33. The composition of the barrier layer in this quantum-well structure is matched to the substrate on which it is grown; the preferred substrate composition for this well structure is $Al_{0.85}Ga_{0.15}N$ for developing emitters at ~240 nm, and for developing emitters between 250-300 nm, an $Al_qGa_{1-q}N$ AONS with q<0.85% can be used. This is an example of an Application-Oriented Nitride Substrate for growth of epitaxial layers for ultraviolet light-emitting structures. Another embodiment of the substrate is the nitride binary substrate of AlN. This is an example of a proper template on an otherwise inappropriate binary substrate. In this case the preferred quantum-well structure is comprised of $Al_{0.95}Ga_{0.05}N/Al_{0.76}Ga_{0.24}N/Al_{0.95}Ga_{0.05}N$. The variation of the deep ultraviolet emission wavelength from such a quantum-well structure as a function of the quantum well width 33 is illustrated in curve 31 of FIG. 4.

Figure 5:
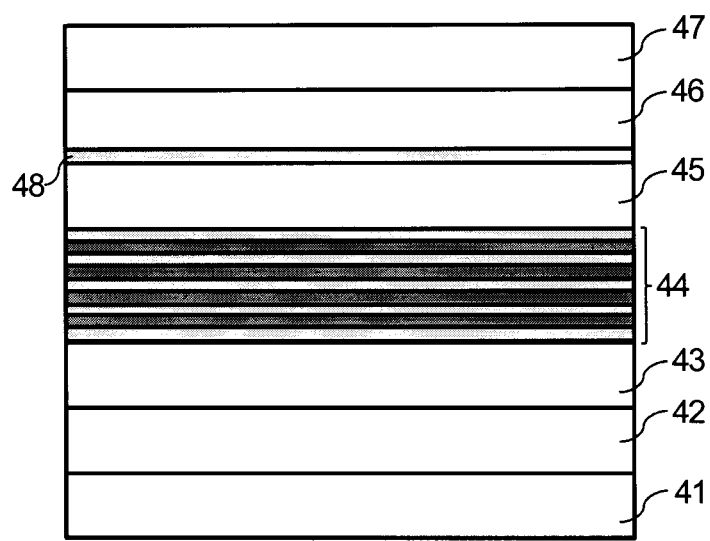
FIG. 5 is a schematic diagram showing the structure of an ultraviolet laser (viewed from one of its end-facets), with the sequence of film layers grown on an $Al_{0.85}Ga_{0.15}N$ ternary substrate.

A preferred layer structure of an ultraviolet light-emitter made from nitride thin films grown on an Application-Oriented Nitride substrate, as discussed in this invention, is illustrated in the diagram in FIG. 5. On top of a ternary $Al_qGa_{1-q}N$ substrate 41 is grown a lower N-type cladding layer 42; this is followed by a lightly doped N-type waveguide layer 43. The active region 44, comprised of several periods of $Al_qGa_{1-q}N/Al_zGa_{1-z}N/Al_qGa_{1-q}N$ multiple quantum wells, is then grown. On top of the active region, the upper waveguide layer 45 is then grown; this is followed by a thin (~2 nm) AlN electron blocking layer 48 whose function is to stop electrons injected from the bottom layers from overflowing from the active region 44. An upper P-type cladding layer 46 is then grown, which is followed by the top Ohmic contact layer 47 for facilitating the top electrode for supplying electrical pumping current to the light-emitter. The preferred embodiment of the top cladding 46 is comprised of a P-type strain-compensated superlattice. This superlattice is comprised of thin layers of $Al_aGa_{1-a}N(1.5\ nm)/Al_bGa_{1-b}N(2\ nm)$ ternary materials with aluminum compositions a and b chosen such that their average atomic lattice constant value is similar to that of the aluminum fraction of the Application-Oriented Nitride Substrate selected for the growth of the desired device structure. The purpose of the strain-compensated superlattice is to reduce the electrical resistance of the upper cladding 46 and thus lower the Ohmic/Joule heating in the device structure. When substrate 41 and the top contact layer 47 are excluded from consideration, the remaining device structure should be symmetric about the center of the active region 44 in the cases where there is no electron blocking layer 48 and a strain-compensating superlattice cladding layer. These would be the cases where the upper cladding is a simple ternary layer. The layers below the active region are doped N-type and those above it are doped P-type.

It should be understood that the present invention is not limited to the embodiments described in the foregoing and in the illustrations contained herein, but that it encompasses any and all variations falling within the scope of the claims appended.

What is claimed:

1. An alloyed nitride compound semiconductor base substrate for epitaxial deposition, comprised of:
   a single crystalline bulk substrate of uniform composition having three constituent elements, wherein
   two of the elements are from group III and one of the elements is from group V of the Periodic Table of elements,
   with In and Al being the elements from group III and N being the element from group V of the Periodic Table of elements and
   the single crystalline bulk substrate has a wurtzite hexagonal crystal structure with a surface for deposition oriented along any of the non-polar or semi-polar [hkil] directions.

2. A nitride laser or light-emitting diode for converting electrical or optical energy into optical energy comprising:
   nitride compound semiconductor substrate being
   a single crystalline substrate having at least three constituent elements, wherein two of the elements are from group III and one of the elements is from group V of the Periodic Table of elements; or
   a single crystalline substrate having at least four constituent elements, wherein three of the elements are from group III and one of the elements is from group V of the Periodic Table of elements; and
   the substrate is doped at a level of $\geq 9\times 10^{18}\ cm^{-3}$;
   with In and Ga being the elements from group III and N being the element from group V of the Periodic Table of elements, on which is deposited a heavily doped N-type compound semiconductor lower cladding layer whose elemental composition results in a lattice constant that closely matches that of the substrate below it, said lower cladding layer being doped at a level of $\geq 9\times 10^{18}\ cm^{-3}$;
   said lower cladding layer being followed by a lightly doped N-type compound semiconductor lower waveguide layer whose lattice constant also nearly matches that of said lower cladding layer, said lower waveguide layer being doped at a level of about $10^{16}\ cm^{-3}$;
   an active region comprised of at least one quantum well layer wherein each quantum well layer is sandwiched between two quantum barrier layers; the lattice constant of each quantum well layer closely matching that of the quantum barrier layers; wherein said quantum barrier layers are of the same elemental composition as the substrate or share the same lattice constant with the substrate;
   each quantum well layer having a compressive or tensile lattice-mismatch from the quantum barrier layers of less than ±3.5%;
   said active region being deposited on top of said lower waveguide layer, whereupon it is covered by a lightly doped P-type upper waveguide layer, said upper waveguide layer being doped at a level of about $10^{16}\ cm^{-3}$;
   said upper waveguide layer being followed by a heavily doped P-type upper cladding layer, said upper cladding layer being doped at a level of $\geq 9\times 10^{18}\ cm^{-3}$;
   said compositions of said plurality of layers having lattice constants within them that closely match that of said nitride compound semiconductor substrate; and
   a low band gap compound semiconductor Ohmic layer that is a heavily doped P-type deposited on top of said plurality of layers, said Ohmic layer being doped at a level of $\geq 9\times 10^{18}\ cm^{-3}$.

3. A semiconductor electronic device comprised of a plurality of compound semiconductor layers that are deposited on the substrate recited in claim 1, wherein the lattice constants of said plurality of compound semiconductor layers closely match that of the base substrate.

4. A semiconductor optoelectronic device comprised of a plurality of compound semiconductor layers deposited on the substrate recited in claim 1, wherein the lattice constants of said plurality of compound semiconductor layers closely match that of the base substrate.

5. A nitride laser or light-emitting diode for converting electrical or optical energy into optical energy comprising:
   a nitride compound semiconductor substrate being
   a single crystalline substrate having at least three constituent elements, wherein two of the elements are from group III and one of the elements is from group V of the Periodic Table of elements; or
   a single crystalline substrate having at least four constituent elements, wherein three of the elements are from group III and one of the elements is from group V of the Periodic Table of elements; and
   the substrate is doped at a level of $\geq 9\times 10^{18}\ cm^{-3}$;
   with Al and Ga being the elements from group III and N being the element from group V of the Periodic Table of elements, on which is deposited a heavily doped N-type compound semiconductor lower cladding layer whose elemental composition results in a lattice constant that closely matches that of the substrate below it, said lower cladding layer being doped at a level of $\geq 9\times 10^{18}\ cm^{-3}$;
   said lower cladding layer being followed by a lightly doped N-type compound semiconductor lower waveguide layer whose lattice constant also nearly matches that of said lower cladding layer, said lower waveguide layer being doped at a level of about $10^{16}$ cm$^{-3}$;

an active region comprised of at least one quantum well layer wherein each quantum well layer is sandwiched between two quantum barrier layers; the lattice constant of each quantum well layer closely matching that of the quantum barrier layers; wherein said quantum barrier layers are of the same elemental composition as the substrate or share the same lattice constant with the substrate;

each quantum well layer having a compressive or tensile lattice-mismatch from the quantum barrier layers of less than ±3.5%;

said active region being deposited on top of said lower waveguide layer, whereupon it is covered by a lightly doped P-type upper waveguide layer, said upper waveguide layer being doped at a level of about $10^{16}$ cm$^{-3}$;

said upper waveguide layer being followed by a heavily doped P-type upper cladding layer, said upper cladding layer being doped at a level of $\geq 9 \times 10^{18}$ cm$^{-3}$;

said compositions of said plurality of layers having lattice constants within them that closely match that of said nitride compound semiconductor substrate; and a low band gap compound semiconductor Ohmic layer that is a heavily doped P-type deposited on top of said plurality of layers, said Ohmic layer being doped at a level of $\geq 9 \times 10^{18}$ cm$^{-1}$.

6. A nitride laser or light-emitting diode for converting electrical or optical energy into optical energy comprising:

a nitride compound semiconductor substrate being a single crystalline substrate having at least three constituent elements, wherein two of the elements are from group III and one of the elements is from group V of the Periodic Table of elements; or a single crystalline substrate having at least four constituent elements, wherein three of the elements are from group III and one of the elements is from group V of the Periodic Table of elements; and the substrate is doped at a level of $\geq 9 \times 10^{18}$ cm$^{-3}$;

with In and Al being the elements from group III and N being the element from group V of the Periodic Table of elements, on which is deposited a heavily doped N-type compound semiconductor lower cladding layer whose elemental composition results in a lattice constant that closely matches that of the substrate below it, said lower cladding layer being doped at a level of $\geq 9 \times 10^{18}$ cm$^{-3}$;

said lower cladding layer being followed by a lightly doped N-type compound semiconductor lower waveguide layer whose lattice constant also nearly matches that of said lower cladding layer, said lower waveguide layer being doped at a level of about $10^{16}$ cm$^{-3}$;

an active region comprised of at least one quantum well layer wherein each quantum well layer is sandwiched between two quantum barrier layers; the lattice constant of each quantum well layer closely matching that of the quantum barrier layers; wherein said quantum barrier layers are of the same elemental composition as the substrate or share the same lattice constant with the substrate;

each quantum well layer having a compressive or tensile lattice-mismatch from the quantum barrier layers of less than ±3.5%;

said active region being deposited on top of said lower waveguide layer, whereupon it is covered by a lightly doped P-type upper waveguide layer, said upper waveguide layer being doped at a level of about $10^{16}$ cm$^{-3}$;

said upper waveguide layer being followed by a heavily doped P-type upper cladding layer, said upper cladding layer being doped at a level of $\geq 9 \times 10^{18}$ cm$^{-3}$;

said compositions of said plurality of layers having lattice constants within them that closely match that of said nitride compound semiconductor substrate; and a low band gap compound semiconductor Ohmic layer that is a heavily doped P-type deposited on top of said plurality of layers, said Ohmic layer being doped at a level of $\geq 9 \times 10^{18}$ cm$^{-3}$.

7. A nitride laser or light-emitting diode for converting electrical or optical energy into optical energy comprising:

nitride compound semiconductor substrate being a single crystalline substrate having at least four constituent elements, wherein three of the elements are from group III and one of the elements is from group V of the Periodic Table of elements; and the substrate is doped at a level of $\geq 9 \times 10^{18}$ cm$^{-3}$, with In, Ga and Al being the elements from group III and N being the element from group V of the Periodic Table of elements, on which is deposited a heavily doped N-type compound semiconductor lower cladding layer whose elemental composition results in a lattice constant that closely matches that of the substrate below it, said lower cladding layer being doped at a level of $\geq 9 \times 10^{18}$ cm$^{-3}$;

said lower cladding layer being followed by a lightly doped N-type compound semiconductor lower waveguide layer whose lattice constant also nearly matches that of said lower cladding layer, said lower waveguide layer being doped at a level of about $10^{16}$ cm$^{-3}$;

an active region comprised of at least one quantum well layer wherein each quantum well layer is sandwiched between two quantum barrier layers; the lattice constant of each quantum well layer closely matching that of the quantum barrier layers wherein said quantum barrier layers are of the same elemental composition as the substrate or share the same lattice constant with the substrate;

each quantum well layer having a compressive or tensile lattice-mismatch from the quantum barrier layers of less than ±3.5%;

said active region being deposited on top of said lower waveguide layer, whereupon it is covered by a lightly doped P-type upper waveguide layer, said upper waveguide layer being doped at a level of about $10^{16}$ cm$^{-3}$;

said upper waveguide layer being followed by a heavily doped P-type upper cladding layer, said upper cladding layer being doped at a level of $\geq 9 \times 10^{18}$ cm$^{-3}$;

said compositions of said plurality of layers having lattice constants within them that closely match that of said nitride compound semiconductor substrate; and a low band gap compound semiconductor Ohmic layer that is a heavily doped P-type deposited on top of said plurality of layers, said Ohmic layer being doped at a level of $\geq 9 \times 10^{18}$ cm$^{-3}$.

8. A device structure grown on the substrate recited in claim 2, 5, 6 or 7.

9. A semiconductor electronic device comprised of a plurality of compound semiconductor layers that are deposited on the substrate recited in claim 2, 5, 6 or 7 wherein the lattice constants of said plurality of compound semiconductor layers closely match that of the substrate.

10. A semiconductor optoelectronic device comprised of a plurality of compound semiconductor layers deposited on the substrate recited in claim 2, 5, 6 or 7 wherein the lattice constants of said plurality of compound semiconductor layers closely match that of the substrate.

11. The nitride laser or light-emitting diode recited in claim 2, wherein all or some of the plurality of layers may be comprised of binary, ternary, or quaternary alloys selected from any of the elements of Al, Ga, In, N.

* * * * *